United States Patent

[11] 3,622,410

[72] Inventor Willis J. Carlson
Fridley, Minn.

[21] Appl. No. 886,228
[22] Filed Dec. 18, 1969
[45] Patented Nov. 23, 1971
[73] Assignee Control Data Corporation
Minneapolis, Minn.

[54] METHOD OF FABRICATING FILM RESISTORS
5 Claims, 2 Drawing Figs.

[52] U.S. Cl. .......... 156/17, 29/195, 117/212, 117/217, 156/11, 156/13, 204/192
[51] Int. Cl. .......... H01l 7/00
[50] Field of Search .......... 204/298, 192; 156/11, 13, 17, 201; 117/212, 217; 29/195

[56] References Cited

UNITED STATES PATENTS 3,242,006 4/1966 Gerstenberg .......... 117/201
3,347,772 10/1967 Laegreid et al. .......... 204/298
3,444,015 5/1969 Baker et al. .......... 156/11
3,477,935 11/1969 Hall .......... 204/192

*Primary Examiner*—Jacob H. Steinberg
*Attorneys*—Richard P. Ulrich, Thomas G. Devine, Joseph A. Genovese and Paul L. Sjoquist

ABSTRACT: A method of fabricating film resistors on a substrate in order to avoid the unsatisfactory result of unwanted chemical etching of the film resistor material. A film of nichrome is sputtered over a substrate. Nitrogen is then sputtered over the layer of nichrome, resulting in a film of nickel nitride over the nitride film forming three layers of film, the first being a nichrome film applied directly to the substrate, the next being a nickel nitride film and finally a nickel film. The nickel film is then selectively etched by a conventional etching process, in order to form ohmic contacts and calibrate the precise resistance desired as a result of the combination of nickel and nichrome. The assembly is heated to the necessary temperature in a prescribed atmosphere to decompose the nickel nitride, leaving only nickel and nichrome on the substrate.

INVENTOR.
WILLIS J. CARLSON
BY Thomas G. Devine
ATTORNEY

METHOD OF FABRICATING FILM RESISTORS

BACKGROUND OF THE INVENTION

This relates to the fabrication of miniaturized, electronic solid-state circuits having resistive material calibrated by, and connected by conductive material, such conductive material further having the facility for attachment of active elements such as transistors and the like.

By the way of example, in the past these circuits have had the resistive elements fabricated by covering a substrate such as aluminum oxide with a film of nichrome and then covering the film of nichrome with a film of nickel, the films having been laid down by such well-known processes as sputtering or evaporation. The nickel is then etched away selectively, thereby forming resistors of any desired ohmic value. The etching is done by any of the well-known etching methods. However, the etchant must be vary carefully controlled because the etching is likely to attack not only the nickel but the nichrome as well. Therefore, very close control of the etchant solution and the time of application is necessary. Of course, prior to the etching of the nickel alone, a desired pattern of nichrome pads could have been obtained through well-known etching techniques, either before or after the application of nickel.

SUMMARY OF THE INVENTION

A film of nickel nitride is introduced between the nichrome film and the nickel film. The nickel nitride film acts as a barrier to any etchant commonly used for etching nickel so that the nichrome is not attacked by the etchant when the nickel film is selectively etched. The nickel nitride film is effectively removed by a subsequent application of heat in an appropriate atmosphere.

Accordingly, an object of this invention is to improve and simplify the fabrication of miniaturized, electronic solid-state circuits.

More particularly, an object is to make the resistors of those circuits very accurate in a highly controllable manner.

Another object is to facilitate the manufacture of very closely spaced conductors connecting and calibrating the resistors.

Still another object is to provide facility for connecting active elements to the conductors of the solid-state circuits.

Further objects and advantages will be ascertained from an understanding of the description of the illustrative embodiment of the invention and from the appended claims.

BRIEF DESCRIPTION OF THE DRAWINGS

FIG. 2 also illustrated the effect of typical metal etchants upon the film structure.

DESCRIPTION OF THE PREFERRED EMBODIMENT

Figure 1:
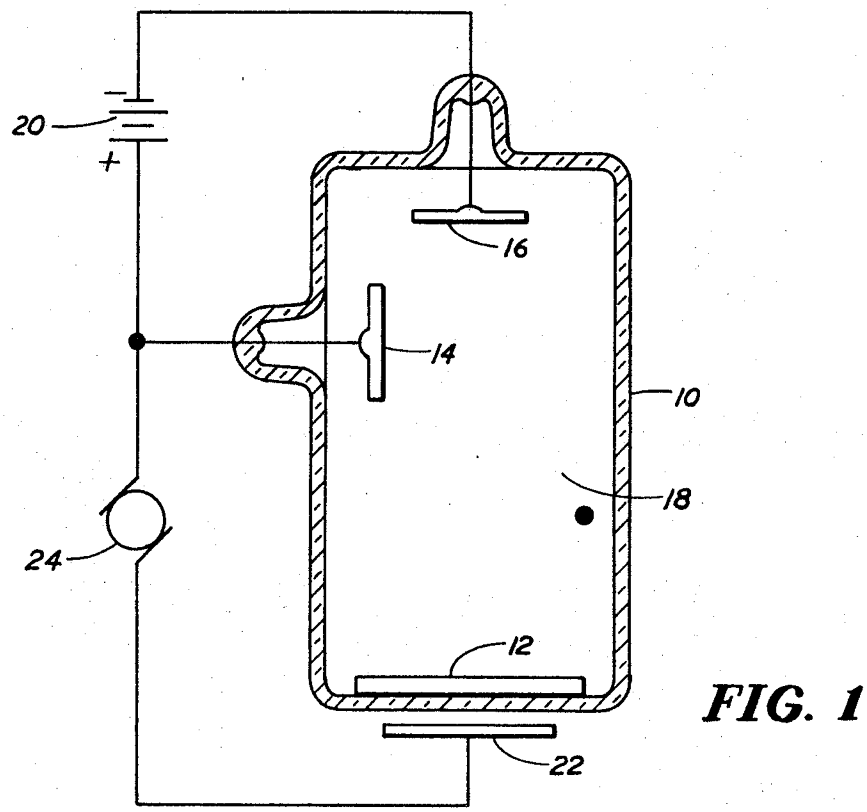
FIG. 1 shows an illustrative example of apparatus suitable for the sputtering processes mentioned above.

In FIG. 1, a vacuum chamber 10 is shown enclosing a substrate 12, an anode 14, a target 16, and a plasma 18. A battery or source of DC potential 20 is shown with its negative terminal connected to target 16 and its positive terminal connected to anode 14. A metal plate or electrode 22 is shown adjacent to substrate 12, but outside the vacuum chamber 10. An alternating voltage generator 24 is shown connected between anode 14 and metal plate 22.

The first step in this process is to insert into vacuum chamber 10 a target 16 which is made of nichrome. The nichrome typically contains more than 70 percent nickel, approximately 20 percent chromium, and aluminum and copper in very small percentages. The vacuum chamber 10 is evacuated to approximately $10^{-7}$ Torr and then an inert gas such as argon is introduced into vacuum chamber 10 to the point where the vacuum is reduced to an appropriate pressure for the sputtering process, which is approximately $10^{-7}$ Torr. Negative potential from DC source 20, in the order of 500 volts, is applied to target 16. An alternating voltage at 44 MHz. is applied to an RF coil (not shown) which encloses the vacuum chamber 10 resulting in excitation of the argon which become ionized, forming plasma 18. Positively charged ions of plasma 18 move rapidly to the negatively character target. Such bombardment of the target results in molecules of nichrome being knocked loose from the target. The molecules migrate to substrate 12 thereby forming a layer of nichrome on substrate 12. Substrate 12 is capacitively coupled to metal plate 22 which in turn is connected to alternating voltage generator 24. The particular choice herein shown of RF biasing between anode 14 and substrate 12 is described in detail in U.S. Pat. No. 3,347,772.

The target 16 is removed and the vacuum chamber 10 is evacuated to approximately $10^{-7}$ Torrs. Nitrogen is introduced into vacuum chamber 10 to the point where the vacuum reaches approximately $10^{-3}$ Torr. The nitrogen is excited by an external RF field, as was the argon, and again a plasma 18 is formed, but with ionized nitrogen atoms. The ions bombard the nichrome-coated substrate resulting in a chemical reaction between the nickel contained in the nichrome alloy and the nitrogen. This chemical action results in the formation of the compound nickel nitride ($Ni_3N$). A protective film of nickel nitride is thereby formed over the nichrome.

A new target 16, made of nickel, is inserted into vacuum chamber 10. Vacuum chamber 10 is again evacuated and argon introduced in a manner identical to that described when the target was made of nichrome. The sputtering process is repeated so that a film of nickel is formed over the nickel nitride film which in turn was formed over the nichrome film. The assembly is ready, at this time, for conventional etching of the nickel film.

If a plurality of nichrome resistors on a single substrate is desired, conventional, well-known techniques to mask off separate areas of nickel are employed, thereby also masking off the nickel nitride and nichrome below each area. Each area will become a separate resistance element when the steps of the invention are complete. The mask necessary to create the desired pattern of nichrome is placed on the nickel surface, the mask being impervious to the etchant, aqua regia which is then applied. The aqua regia etches away the unprotected nickel, the nickel nitride film directly adjacent the unprotected nickel, and finally the nichrome exposed by the etching away of the nickel nitride. Thus a plurality of separate nichrome film areas each having a film of nickel nitride covering it and with nickel covering the nickel nitride are formed.

Figure 2:
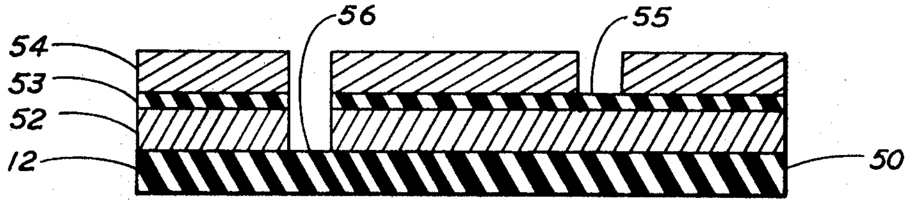
FIG. 2 is a side view of a typical substrate made of aluminum oxide covered by a film of nichrome, then nickel nitride and finally nickel.

Using conventional, well-known techniques to mask off those portions of nickel which are not to be etched, an etchant such as ferric chloride is applied. The ferric chloride reacts with the exposed nickel, etching it away. However, the ferric chloride does not react with the nickel nitride. The nichrome then, is not subjected to the ferric chloride. FIG. 2 shows a typical film assembly 50 which is comprised of substrate 12, typically a material such as aluminum oxide, the substrate being covered by nichrome film 52 which in turn is covered by nickel nitride film 53. Nickel film 54 with apertures 55 and 56 covers the nickel nitride film 53. Apertures 55 has been formed by etching with ferric chloride and aperture 56 has been formed by etching with aqua regia.

After the desired pattern of nickel has been formed by the application of ferric chloride, the film assembly is subjected to a temperature of approximately 400° C. in a reducing atmosphere of typically 80 percent nitrogen and 20 percent hydrogen. Under these conditions, the nickel nitride decomposes into nickel leaving the nichrome to act as the major electrical conductor.

Those skilled in the art are aware that many variations are possible within the teaching of the present invention. For example, with reference to FIG. 1, DC biasing could be used with a direct connection to the substrate 12, instead of the AC biasing herein described. A gas other than argon could be used and the negative potential applied to target 16 could be varied, depending upon the gas used and the dimensions of the vacuum chamber 10. It is also obvious that the nichrome film, after the first sputtering process, could be formed in any desired pattern, such procedure possibly being accomplished through a conventional etching technique where the etchant could be a substance such as aqua regia. Further, the deposition process is not limited to sputtering, but an evaporation process might be used. Certainly many different geometric configurations could be used.

I claim:

1. A method of fabricating a film assembly for use in electronic circuitry, comprising the steps of:

a. forming a film of nichrome on a substrate by vacuum deposition;

b. forming a film of nickel nitride over the nichrome by causing a chemical reaction between the nichrome and nitrogen;

c. forming a nickel film over the nickel nitride film by vacuum deposition;

d. etching the nickel in a desired pattern; and e. decomposing the nickel nitride.

2. The method of claim 1 wherein the vacuum deposition is accomplished by sputtering.

3. The method of claim 1 wherein the nickel nitride is disposed of by:

decomposing the nickel nitride by heating the film in a reducing atmosphere.

4. A method of forming a film resistor for use in electronic circuitry, comprising the steps of:

a. forming a film of nichrome on a substrate by sputtering;

b. forming a film of nickel nitride over the sputtered nichrome by ionizing nitrogen to cause a collision of nitrogen ions with the nichrome film causing a reaction between the nitrogen and nickel constituent of the nichrome;

c. forming a film of nickel over the nickel nitride by sputtering;

d. etching the nickel in a desired pattern; and e. decomposing the nickel nitride film by heating in a reducing atmosphere.

5. The method of claim 4 wherein the nickel nitride is disposed of by:

decomposing the nickel by heating in a reducing atmosphere.

* * * * *